(12) United States Patent
Lee et al.

(10) Patent No.: US 11,355,287 B2
(45) Date of Patent: Jun. 7, 2022

(54) MULTILAYER CAPACITOR AND BOARD INCLUDING THE SAME MOUNTED THEREON

(71) Applicant: SAMSUNG ELECTRO-MECHANICS CO., LTD., Suwon-si (KR)

(72) Inventors: Sang Jong Lee, Suwon-si (KR); Su Bong Jang, Suwon-si (KR); Hee Soo Yoon, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 114 days.

(21) Appl. No.: 16/849,612

(22) Filed: Apr. 15, 2020

(65) Prior Publication Data

US 2021/0183578 A1     Jun. 17, 2021

(30) Foreign Application Priority Data

Dec. 13, 2019   (KR) .......................... 10-2019-0167023

(51) Int. Cl.
*H01G 4/30* (2006.01)
*H01G 4/12* (2006.01)
(Continued)

(52) U.S. Cl.
CPC .............. *H01G 4/30* (2013.01); *H01G 4/012* (2013.01); *H01G 4/12* (2013.01); *H01G 4/228* (2013.01)

(58) Field of Classification Search
CPC ........ H01G 4/38; H01G 4/012; H01G 4/1227; H01G 4/2325; H01G 4/008; H01G 4/242;
(Continued)

(56) References Cited

U.S. PATENT DOCUMENTS

2010/0039749 A1\* 2/2010 Ritter ..................... H01G 4/005
361/301.4
2015/0014035 A1\* 1/2015 Park ....................... H01G 4/012
174/260
(Continued)

FOREIGN PATENT DOCUMENTS

JP         2012-023752 A    2/2012
KR   10-2009-0117686 A    11/2009

*Primary Examiner* — Michael P McFadden
(74) *Attorney, Agent, or Firm* — Morgan, Lewis & Bockius LLP

(57) ABSTRACT

A multilayer capacitor and a board on which the multilayer capacitor is mounted provide increased capacitor effective area. The multilayer capacitor includes a capacitor body having first and second dielectric layers each with first and second internal electrodes, first and second external electrodes disposed on a surface of the capacitor body, a first via electrode connecting the first internal electrodes to the first external electrode, and a second via electrode connecting the second internal electrodes to the second external electrode. The first and second dielectric layers are alternately stacked in the first direction such that the first internal electrode of the first dielectric layer overlaps the second internal electrode of the second dielectric layer in a first direction, and the second internal electrode of the first dielectric layer overlaps the first internal electrode of the second dielectric layer in the first direction.

25 Claims, 9 Drawing Sheets

(51) Int. Cl.
*H01G 4/012* (2006.01)
*H01G 4/228* (2006.01)

(58) Field of Classification Search
CPC ............ H01G 4/30; H01G 4/252; H01G 4/12; H01G 4/228; H01L 21/4857; H01L 21/486; H01L 23/49822; H01L 23/49827; H01L 23/49838
See application file for complete search history.

(56) References Cited

U.S. PATENT DOCUMENTS

| | | | |
|---|---|---|---|
| 2015/0068792 A1* | 3/2015 | Cho | H01G 2/06 |
| | | | 174/258 |
| 2017/0194419 A1* | 7/2017 | Lee | H01C 1/14 |
| 2018/0019064 A1* | 1/2018 | Han | H01G 4/008 |
| 2018/0068796 A1* | 3/2018 | Seo | H05K 1/111 |
| 2020/0135400 A1* | 4/2020 | Sakurai | H05K 1/181 |

* cited by examiner

MULTILAYER CAPACITOR AND BOARD INCLUDING THE SAME MOUNTED THEREON

CROSS-REFERENCE TO RELATED APPLICATION(S)

This application claims benefit of priority to Korean Patent Application No. 10-2019-0167023 filed on Dec. 13, 2019 in the Korean Intellectual Property Office, the disclosure of which is incorporated herein by reference in its entirety.

BACKGROUND

1. Field

The present disclosure relates to a multilayer capacitor and a board including the same mounted thereon.

2. Description of Related Art

As a thickness of a smartphone has been reduced, electronic components have been designed to have reduced weight and thickness and improved integration density, and greater numbers of passive than active elements have been applied to an electronic device.

As a part of these trends, there has been increased interest in multilayer capacitors among such passive elements. That is because a greater number of multilayer capacitors may be mounted on a circuit than other types of passive elements, and with the development of microelectronics technology, decoupling capacitors having increased capacitance and reduced connection length have been required. Accordingly, the importance of multilayer capacitors in electrical circuits has increased.

Also, such multilayer capacitors have been required to have low equivalent series resistance (ESR) to implement high efficiency with the same capacitance and to have low equivalent serial inductance (ESL) to significantly reduce a ripple of a power current.

SUMMARY

An aspect of the present disclosure is to provide a multilayer capacitor having high capacitance, reduced ESR, and reduced ESL.

According to an aspect of the present disclosure, a multilayer capacitor includes a capacitor body including first and second surfaces opposing each other, third and fourth surfaces connected to the first and second surfaces and opposing each other, fifth and sixth surfaces connected to the first and second surfaces and to the third and fourth surfaces and opposing each other, and including first and second dielectric layers and pluralities of first and second internal electrodes alternately layered in a first direction in which the first and second surfaces are connected to each other. First and second external electrodes are disposed on the first surface of the capacitor body and spaced apart from each other, a first via electrode connects the plurality of first internal electrodes to the first external electrode in the capacitor body, and a second via electrode connects the plurality of second internal electrodes to the second external electrode in the capacitor body. First and second internal electrodes are spaced apart from each other on the first dielectric layer, and first and second internal electrodes are spaced apart from each other on the second dielectric layer.

The first and second dielectric layers are alternately stacked in the first direction such that the first internal electrode of the first dielectric layer overlaps the second internal electrode of the second dielectric layer in the first direction, and the second internal electrode of the first dielectric layer overlaps the first internal electrode of the second dielectric layer in the first direction.

The first and second internal electrodes on the second dielectric layer may be symmetrical to the first and second internal electrodes disposed on the first dielectric layer about a plan orthogonal to a second direction in which the fifth and sixth surfaces are connected to each other.

The plurality of first internal electrodes may include a 1-1st internal electrode disposed on the first dielectric layer; a 1-2nd internal electrode disposed on the second dielectric layer to not overlap the 1-1st internal electrode in the first direction; a 1-1st connection portion connected to the 1-1st internal electrode and connected to the first via electrode; and a 1-2nd connection portion connected to the 1-2nd internal electrode, disposed to overlap the 1-1st connection portion in the first direction, and connected to the first via electrode. The plurality of second internal electrodes may include a 2-1st internal electrode disposed on the first dielectric layer to overlap the 1-2nd internal electrode in the first direction; a 2-2nd internal electrode disposed on the second dielectric layer to overlap the 1-1st internal electrode in the first direction; a 2-1st connection portion connected to the 2-1st internal electrode and connected to the second via electrode; and a 2-2nd connection portion connected to the 2-2nd internal electrode, disposed to overlap the 2-1st connection portion in the first direction, and connected to the second via electrode.

A first via through hole may be disposed in the first dielectric layer, the second dielectric layer, the 1-1st connection portion, and the 1-2nd connection portion such that the first via electrode may penetrate through the first dielectric layer, the second dielectric layer, the 1-1st connection portion, and the 1-2nd connection portion in the first direction. A second via through hole may be disposed in the first dielectric layer, the second dielectric layer, the 2-1st connection portion, and the 2-2nd connection portion such that the second via electrode may penetrate through the first dielectric layer, the second dielectric layer, the 2-1st connection portion, and the 2-2nd connection portion in the first direction.

Each of the first and second internal electrodes may have an L-shaped form.

The plurality of first internal electrodes may include a 1-1st internal electrode disposed on the first dielectric layer; a plurality of 1-2nd internal electrodes disposed on the second dielectric layer to not overlap the 1-1st internal electrode in the first direction; a 1-1st connection portion connected to the 1-1st internal electrode and connected to the first via electrode; and a 1-2nd connection portion connected to the plurality of 1-2nd internal electrodes, disposed to overlap the 1-1st connection portion in the first direction, and connected to the first via electrode. The plurality of second internal electrodes may include a plurality of 2-1st internal electrodes disposed on the first dielectric layer to overlap the plurality of 1-2nd internal electrodes in the first direction; a 2-2nd internal electrode disposed on the second dielectric layer to overlap the 1-1st internal electrode in the first direction; a 2-1st connection portion connected to the plurality of 2-1st internal electrodes and connected to the second via electrode; and a 2-2nd connection portion connected to the 2-2nd internal electrode, disposed to overlap the 2-1st connection portion in the first direction, and connected to the second via electrode.

A first via through hole may be disposed in the first dielectric layer, the second dielectric layer, the 1-1st connection portion, and the 1-2nd connection portion such that the first via electrode penetrates through the first dielectric layer, the second dielectric layer, the 1-1st connection portion, and the 1-2nd connection portion in the first direction, and a second via through hole may be disposed in the first dielectric layer, the second dielectric layer, the 2-1st connection portion, and the 2-2nd connection portion such that the second via electrode penetrates through the first dielectric layer, the second dielectric layer, the 2-1st connection portion, and the 2-2nd connection portion in the first direction.

Each of a combination structure of the 1-1st internal electrode and the 1-1st connection portion and a combination structure of the 2-2nd internal electrode and the 2-2nd connection portion may have a "⌐"-shaped form, and each of a combination structure of the 1-2nd internal electrode and the 1-2nd connection portion and a combination structure of the 2-1st internal electrode and the 2-1st connection portion may have a "⊏"-shaped form.

The plurality of first internal electrodes may include a plurality of 1-1st internal electrodes disposed on the first dielectric layer and spaced apart from each other in the second direction; a plurality of 1-2nd internal electrodes disposed on the second dielectric layer to not overlap the plurality of 1-1st internal electrodes in the first direction and to be spaced apart from each other in the second direction; a 1-1st connection portion connected to the plurality of 1-1st internal electrodes and connected to the first via electrode; and a 1-2nd connection portion connected to the plurality of 1-2nd internal electrodes and disposed to overlap the 1-1st connection portion in the first direction and to be connected to the first via electrode. The plurality of second internal electrodes may include a plurality of 2-1st internal electrodes disposed on the first dielectric layer to overlap the plurality of 1-2nd internal electrodes in the first direction and to be spaced apart from each other in the second direction; a plurality of 2-2nd internal electrode disposed on the second dielectric layer to overlap the plurality of 1-1st internal electrodes in the first direction, and to be spaced apart from each other in the second direction; a 2-1st connection portion connected to the plurality of 2-1st internal electrodes and connected to the second via electrode; and a 2-2nd connection portion connected to the plurality of 2-2nd internal electrodes and disposed to overlap the 2-1st connection portion in the first direction and to be connected to the second via electrode.

A first via through hole may be disposed in the first dielectric layer, the second dielectric layer, the 1-1st connection portion, and the 1-2nd connection portion such that the first via electrode may penetrate through the first dielectric layer, the second dielectric layer, the 1-1st connection portion, and the 1-2nd connection in the first direction, and a second via through hole may be disposed in the first dielectric layer, the second dielectric layer, the 2-1st connection portion, and the 2-2nd connection portion such that the second via electrode may penetrate through the first dielectric layer, the second dielectric layer, the 2-1st connection portion, and the 2-2nd connection portion in the first direction.

According to an aspect of the present disclosure, a board on which a multilayer capacitor is mounted includes a board having first and second electrode pads on one surface; and the multilayer capacitor, wherein the first and second external electrodes are connected to the first and second electrode pads, respectively.

According to an aspect of the present disclosure, a multilayer capacitor includes a capacitor body including a plurality of dielectric layers stacked with each other and each having a first internal electrode and a second internal electrode disposed thereon, and first and second external electrodes disposed on at least one external surface of the body. The first external electrode is connected to the first internal electrode disposed on each of the plurality of dielectric layers, and the second external electrode is connected to the second internal electrode disposed on each of the plurality of dielectric layers.

According to an aspect of the present disclosure, a multilayer capacitor includes a capacitor body including a plurality of dielectric layers stacked with each other and each having a first internal electrode, a first connection portion, a second internal electrode, and a second connection portion disposed thereon; and first and second external electrodes disposed on at least one external surface of the body. Each of the first internal electrode, the first connection portion, the second internal electrode, and the second connection portion has a rectangular shape having a length greater than a width. The first internal electrode and the first connection portion are connected to each other and have lengths orthogonal to each other, and the second internal electrode and the second connection portion are connected to each other and have lengths orthogonal to each other. The first connection portion on each of the plurality of dielectric layers overlap with each other in a stacking direction, and the second connection portion on each of the plurality of dielectric layers overlap with each other in the stacking direction.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
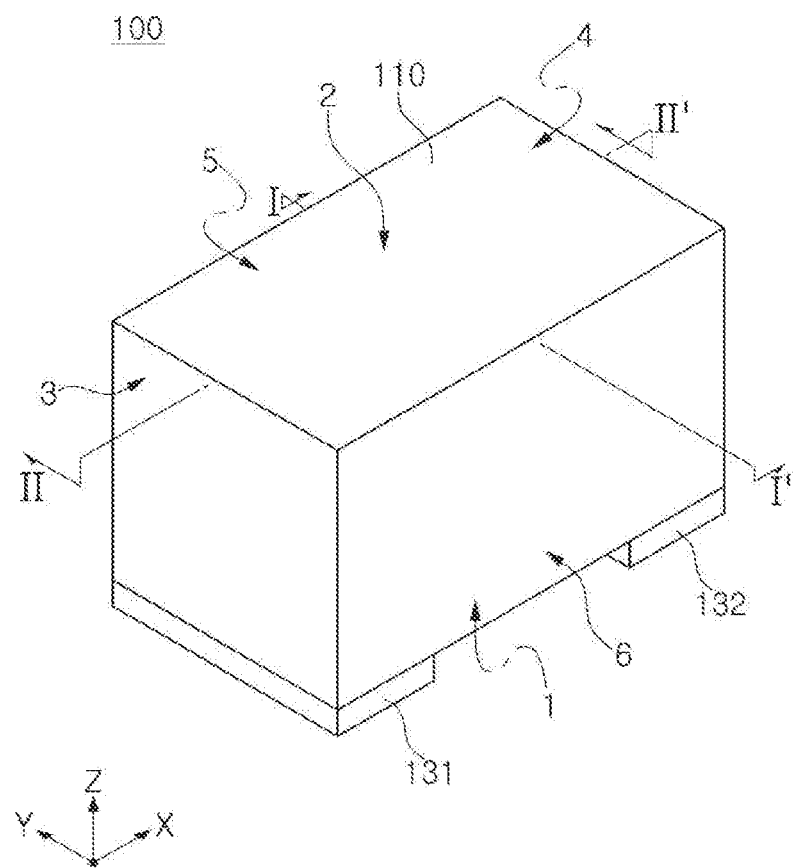
FIG. 1 is a perspective diagram illustrating a multilayer capacitor according to an example embodiment of the present disclosure.

Hereinafter, embodiments of the present disclosure will be described as follows with reference to the attached drawings.

The present disclosure may, however, be exemplified in many different forms and should not be construed as being limited to the specific embodiments set forth herein.

Rather, these embodiments are provided so that this disclosure will be thorough and complete, and will fully convey the scope of the disclosure to those skilled in the art.

Accordingly, shapes and sizes of elements in the drawings may be exaggerated for clarity of description, and elements indicated by the same reference numeral may correspond to same elements in the drawings.

Further, throughout the specification, it will be understood that when a portion "includes" an element, it can further include another element, without excluding further element(s), unless otherwise indicated.

In the drawings, an X direction, a Y direction, and a Z direction may indicate a length direction, a width direction, and a thickness direction of a capacitor body 110, respectively.

Figure 2:
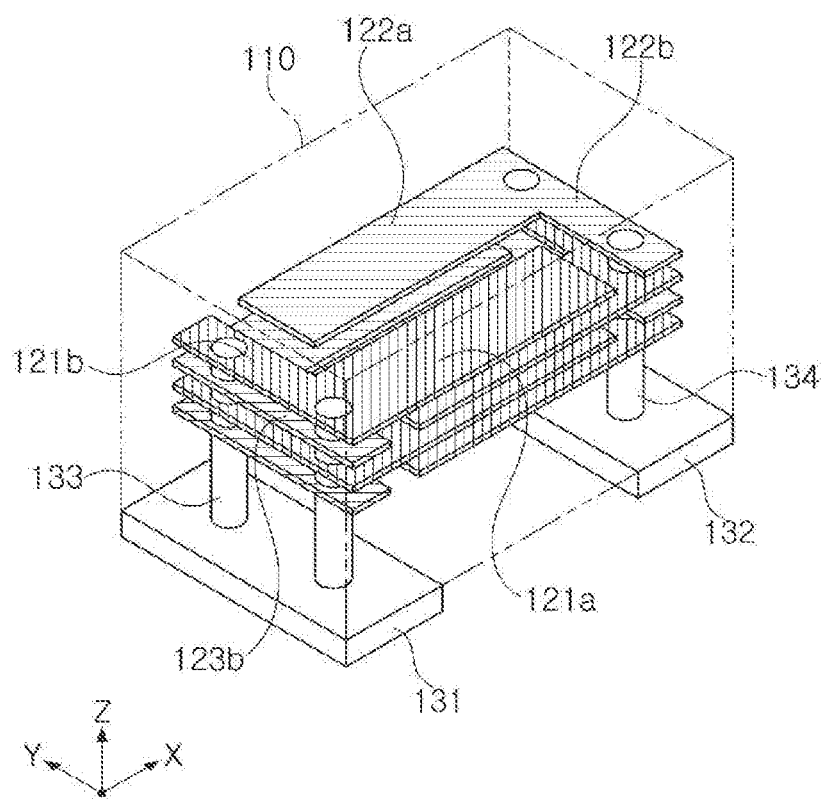
FIG. 2 is a transparent perspective diagram of the multilayer capacitor of FIG. 1.
Figure 3A:
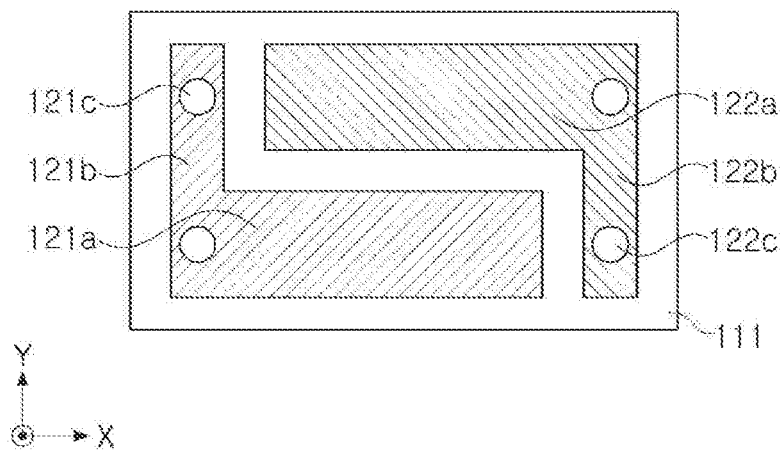
FIGS. 3A and 3B are plan diagrams illustrating first and second dielectric layers and first and second internal electrodes.
Figure 3B:
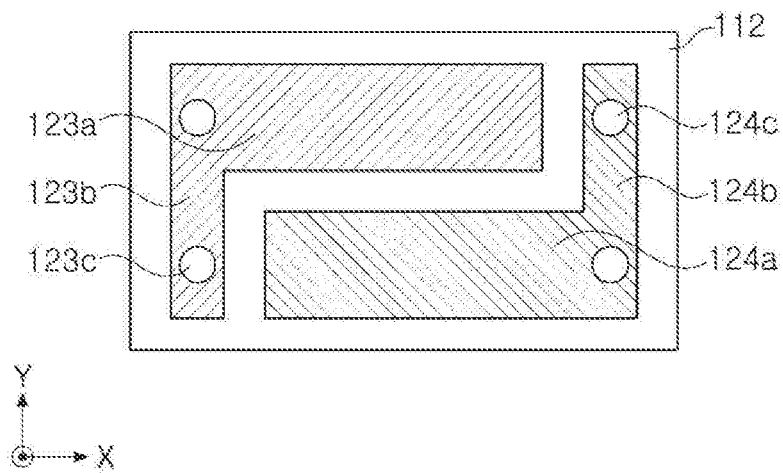
Figure 4:
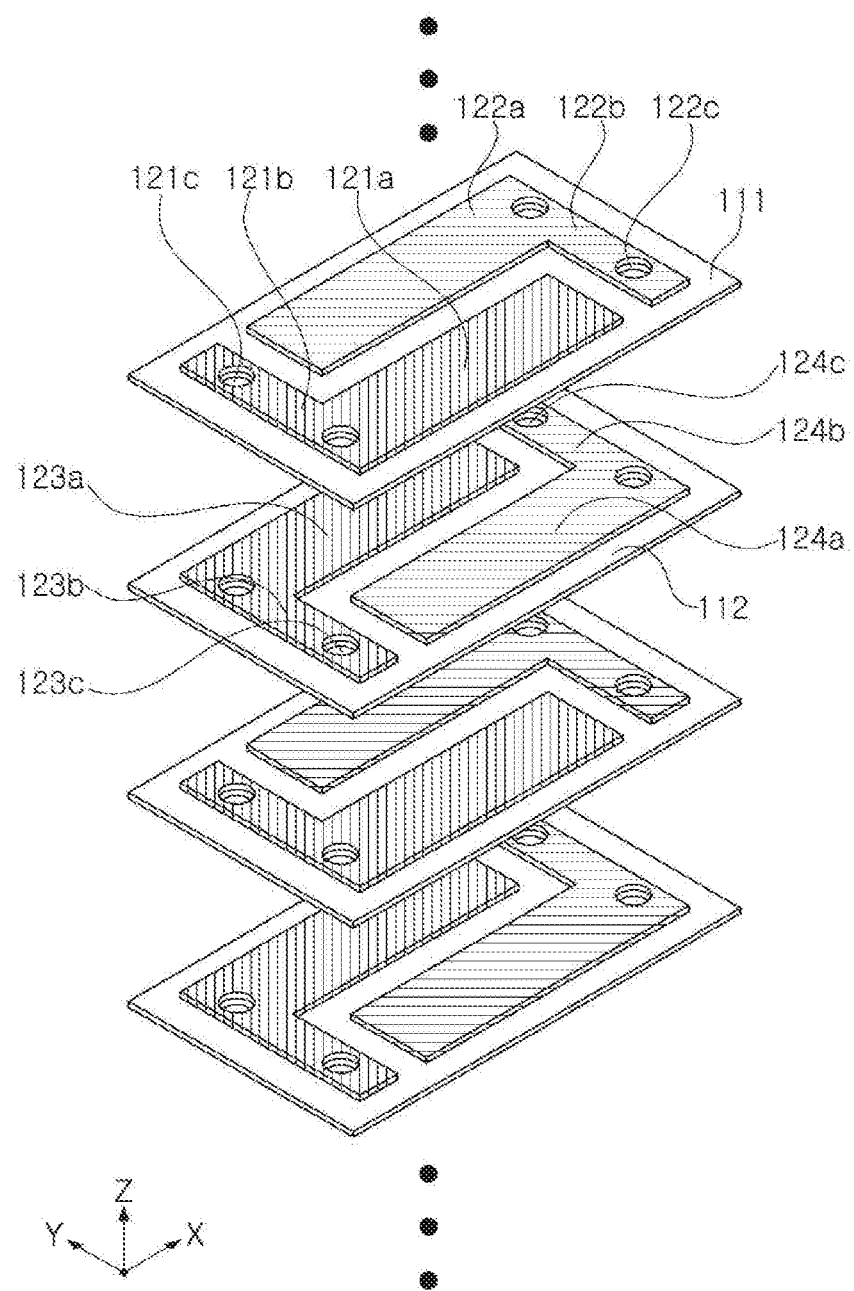
FIG. 4 is a perspective diagram illustrating a laminate structure of first and second dielectric layers of the multilayer capacitor illustrated in FIG. 1.
Figure 5:
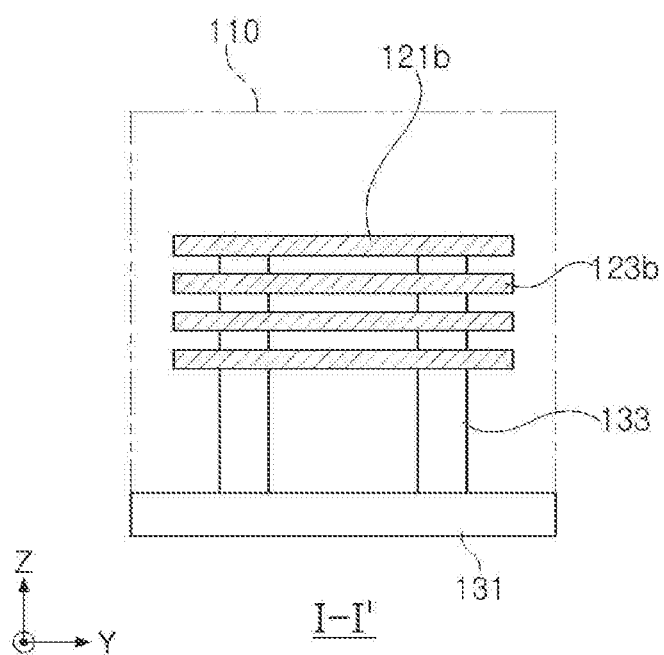
FIG. 5 is a cross-sectional diagram taken along line I-I' in FIG. 1.

FIG. 1 is a perspective diagram illustrating a multilayer capacitor according to an example embodiment. FIG. 2 is a transparent perspective diagram of the multilayer capacitor of FIG. 1. FIGS. 3A and 3B are plan diagrams illustrating first and second dielectric layers and first and second internal electrodes. FIG. 4 is a perspective diagram illustrating a laminate structure of first and second dielectric layers of a multilayer capacitor. FIG. 5 is a cross-sectional diagram taken along line I-I' in FIG. 1.

Referring to FIGS. 1, 2, 3A, 3B, 4, and 5, a multilayer capacitor 100 in the example embodiment may include a capacitor body 110, first and second external electrodes 131 and 132, and first and second via electrodes 133 and 134.

The capacitor body 110 may be formed by layering a plurality of first and second dielectric layers 111 and 112 in the Z direction and performing a sintering process. A boundary between adjacent first and second dielectric layers 111 and 112 of the capacitor body 110 may be integrated such that it may be difficult to identify the boundary without using a scanning electron microscope (SEM).

The capacitor body 110 may have a hexahedral shape, but an external embodiment thereof is not limited thereto. A shape and a size of the capacitor body 110 and the number of the first and second dielectric layers 111 and 112 may not be limited to the examples illustrated in the diagrams.

In the example embodiment, both surfaces of the capacitor body 110 opposing each other in the Z direction may be defined as first and second surfaces 1 and 2, both surfaces connected to the first and second surfaces 1 and 2 and opposing each other in the X direction may be defined as third and fourth surfaces 3 and 4, and both surfaces connected to the first and second surfaces 1 and 2 and the third and fourth surfaces 3 and 4 and opposing each other in the Y direction may be defined as fifth and sixth surfaces 5 and 6.

The first and second dielectric layers 111 and 112 may include a ceramic material having a high dielectric constant. For example, the first and second dielectric layers 111 and 112 may include barium titanate ($BaTiO_3$) based powder or strontium titanate ($SrTiO_3$) based ceramic powder. However, an example of the material is not limited thereto as along as sufficient capacitance can be obtained therewith.

The first and second dielectric layers 111 and 112 may further include ceramic additives, organic solvents, plasticizers, coupling agents, dispersing agents, and the like, in addition to the ceramic powder.

The ceramic additive may include, for example, a transition metal oxide or a transition metal carbide, a rare earth element, magnesium (Mg) or aluminum (Al), and the like.

The capacitor body 110 may include an active region as a portion contributing to forming capacitance of the capacitor, and upper and lower cover regions formed on and below the active region in the Z direction as upper and lower margin portions.

The upper and lower cover regions may have a material and a configuration the same as those of the first and second dielectric layers 111 and 112 other than the configuration in which the upper and lower cover regions do not include an internal electrode.

The upper and lower cover regions may be formed by disposing a single dielectric layer or layering two or more dielectric layers on upper and lower surfaces of the active region in the Z direction, and may prevent damage to an internal electrode caused by physical or chemical stress.

The capacitor body 110 may include the first internal electrode(s) and the second internal electrode(s).

The first and second internal electrodes may be provided with different polarities, may each be disposed on one surface of a respective one of the first and second dielectric layers 111 and 112, and may be spaced apart from each other.

The first and second internal electrodes may be spaced apart from an edge of the capacitor body 110, the first internal electrode may be connected to the first external electrode 131, and the second internal electrode may be connected to the second external electrode 132.

Accordingly, when a certain level of voltage is applied to the first and second external electrodes 131 and 132, an electric charge may be accumulated between the first and second internal electrodes.

Capacitance of the multilayer capacitor 100 may be proportional to an area of overlap between the first and second internal electrodes overlapping in the Z direction in the active region.

A material of the first and second internal electrodes is not limited to any particular material, and may be formed using a conductive paste including one or more materials from among noble materials such as platinum (Pt), palladium (Pd), palladium-silver (Pd—Ag) alloy, and the like, nickel (Ni), and copper (Cu).

As a method of printing the conductive paste, a screen-printing method or a gravure printing method may be used, but an example of the method is not limited thereto.

The first and second external electrodes 131 and 132 may be provided with voltages having different polarities, may be disposed on the first surface 1 of the capacitor body 110 and may be spaced apart from each other in the X direction, and may respectively be electrically connected to the plurality of first and second internal electrodes through the first via electrode and the second via electrode 133 and 134.

In the example embodiment, the first and second external electrodes 131 and 132 may only be formed on the first surface 1 of the capacitor body 110.

Accordingly, an overall mounting area of the multilayer capacitor may be relatively reduced as compared to a general structure in which external electrodes are formed on the right and left sides of the capacitor body. Accordingly, mounting density of the board may improve.

The first and second external electrodes 131 and 132 may further include a plating layer configured to cover each of surfaces of the first and second external electrodes 131 and 132.

The first via electrode 133 may be configured to penetrate through the capacitor body 110 in the Z direction and may connect the plurality of first internal electrodes to the first external electrode 131.

The first via electrode 133 may be disposed adjacent to the third surface 3 of the capacitor body 110 to increase an effective area of the internal electrode.

In the example embodiment, two first via electrodes 133 may be spaced apart from each other in the Y direction in the capacitor body 110 as illustrated in the diagram, but an example embodiment thereof is not limited thereto. The number of first via electrode(s) 133 may be one, or may be three or more.

The second via electrode 134 may be configured to penetrate through the capacitor body 110 in the Z direction and may connect the plurality of second internal electrodes to the second external electrode 132.

The second via electrode 134 may be disposed adjacent to the fourth surface 4 of the capacitor body 110 to increase an effective area of the internal electrode.

In the example embodiment, two second via electrodes 134 may be spaced apart from each other in the Y direction in the capacitor body 110, as illustrated in the diagram, but an example embodiment thereof is not limited thereto. The number of second via electrode (s) 134 may be one, or may be three or more.

In the example embodiment, two or more internal electrodes may be disposed in each of the first dielectric layer 111 and the second dielectric layer 112, and the first and second internal electrodes may be spaced apart from each other on the first dielectric layer 111 and also on the second dielectric layer 112.

In other words, the first and second internal electrodes may be spaced apart from each other on a first dielectric layer 111, and the first and second internal electrodes may be spaced apart from each other on a second dielectric layer 112. In the multilayer capacitor 100, the first and second dielectric layers 111 and 112 may be alternately layered in the Z direction such that the first internal electrode of the first dielectric layer 111 may overlap the second internal electrode of the second dielectric layer 112 in the Z direction, and the second internal electrode of the first dielectric layer 111 may overlap the first internal electrode of the second dielectric layer 112 in the Z direction.

The first internal electrode disposed on the first dielectric layer 111 and the first internal electrode disposed on the second dielectric layer 112 may be symmetrical to each other in the Y direction (e.g., symmetrical to each other around a plane orthogonal to the Y direction).

The second internal electrode disposed on the first dielectric layer 111 and the second internal electrode disposed on the second dielectric layer 112 may be symmetrical to each other in the Y direction (e.g., symmetrical to each other around a plane orthogonal to the Y direction).

In the example embodiment, the first internal electrode may include a 1-1st internal electrode 121a, a 1-2nd internal electrode 123a, a 1-1st connection portion 121b, and a 1-2nd connection portion 123b.

The 1-1st internal electrode 121a may be disposed on the first dielectric layer 111 and may be spaced apart from an edge of the first dielectric layer 111.

The 1-2nd internal electrode 123a may be disposed on the second dielectric layer 112, may be spaced apart from an edge of the second dielectric layer 112, and may be configured to not overlap the 1-1st internal electrode 121a in the Z direction (when the first and second dielectric layers 111 and 112 are stacked in the capacitor body 110).

The 1-1st connection portion 121b may be a portion extending in the +Y direction from a left-most end of the 1-1st internal electrode 121a, and may be connected to the first via electrode 133.

The 1-2nd connection portion 123b may be a portion extending in the −Y direction from a left-most end of the 1-2nd internal electrode 123a, and may be disposed in a position in which the 1-2nd connection portion 123b overlaps the 1-1st connection portion 121b in the Z direction, and may be connected to the first via electrode 133.

The 1-1st connection portion 121b and the 1-2nd connection portion 123b may be disposed adjacent to the third surface 3 of the capacitor body 110 to increase an effective area of the internal electrode.

The 1-1st internal electrode 121a may be configured to be adjacent to the right side in the Y direction on the first dielectric layer 111, and the 1-2nd internal electrode 123a may be configured to be adjacent to the left side in the Y direction on the second dielectric layer 112. Accordingly, when the capacitor body 110 is formed by layering the first and second dielectric layers 111 and 112 in the Z direction, the 1-1st internal electrode 121a and the 1-2nd internal electrode 123a may not overlap each other in the Z direction (when the first and second dielectric layers 111 and 112 are stacked in the capacitor body 110).

First via through holes 121c and 123c may be formed in the 1-1st connection portion 121b and the 1-2nd connection portion 123b and portions of the first dielectric layer 111 and the second dielectric layer 112 corresponding to the 1-1st connection portion 121b and the 1-2nd connection portion 123b such that the first via electrode 133 may penetrate through the 1-1st connection portion 121b, the 1-2nd connection portion 123b, the first dielectric layer 111, and the second dielectric layer 112 in the Z direction.

Accordingly, each of a combination structure of the 1-1st internal electrode 121a and the 1-1st connection portion 121b and a combination structure of the 1-2nd internal electrode 123a and the 1-2nd connection portion 123b may have an "L"-shaped form.

The second internal electrode may include a 2-1st internal electrode 122a, a 2-2nd internal electrode 124a, a 2-1st connection portion 122b, and a 2-2nd connection portion 124b.

The 2-1st internal electrode 122a may be disposed on the first dielectric layer 111 and may be spaced apart from an edge of the first dielectric layer 111.

The 2-2nd internal electrode 124a may be disposed on the second dielectric layer 112, may be spaced apart from an edge of the second dielectric layer 112, and may be configured to not overlap the 2-1st internal electrode 122a in the Z direction (when the first and second dielectric layers 111 and 112 are stacked in the capacitor body 110).

The 2-1st connection portion 122b may be a portion extending in the −Y direction from a right-most end of the 2-1st internal electrode 122a, and may be connected to the second via electrode 134.

The 2-2nd connection portion 124b may be a portion extending in the +Y direction from a right-most end of the 2-2nd connection portion 124b, and may be disposed in a position in which the 2-2nd connection portion 124b overlaps the 2-1st connection portion 122b in the Z direction, and may be connected to the second via electrode 134.

The 2-1st connection portion 122b and the 2-2nd connection portion 124b may be disposed adjacent to the fourth surface 4 of the capacitor body 110 to increase an effective area of the internal electrode.

In other words, the 2-1st internal electrode 122a may be disposed adjacent to the left side in the Y direction on the first dielectric layer 111, and the 2-2nd internal electrode 124a may be formed adjacent to the right side in the Y direction on the second dielectric layer 112. Accordingly, when the capacitor body 110 is formed by layering the first and second dielectric layers 111 and 112 in the Z direction, the 2-1st internal electrode 122a and the 2-2nd internal electrode 124a may not overlap each other in the Z direction (when the first and second dielectric layers 111 and 112 are stacked in the capacitor body 110).

Second via through holes 122c and 124c may be formed in the 2-1st connection portion 122b and the 2-2nd connection portion 124b and portions of the first dielectric layer 111 and the second dielectric layer 112 corresponding to the 2-1st connection portion 122b and the 2-2nd connection portion 124b such that the second via electrode 134 may penetrate through the 2-1st connection portion 122b, the 2-2nd connection portion 124b, the first dielectric layer 111, and the second dielectric layer 112 in the in the Z direction.

Accordingly, each of a combination structure of the 2-1st internal electrode 122a and the 2-1st connection portion 122b and a combination structure of the 2-2nd internal electrode 124a and the 2-2nd connection portion 124b may be configured to have an "L"-shaped form.

Figure 6A:
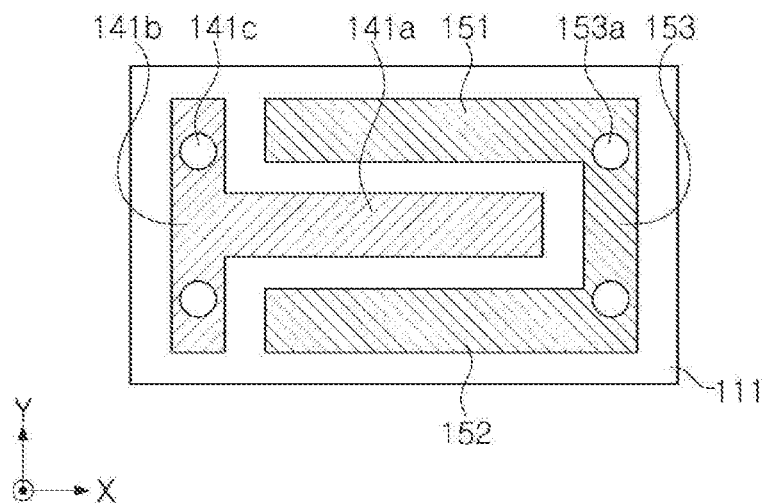
FIGS. 6A and 6B are plan diagrams illustrating another example embodiment of first and second internal electrodes of a multilayer capacitor.
Figure 6B:
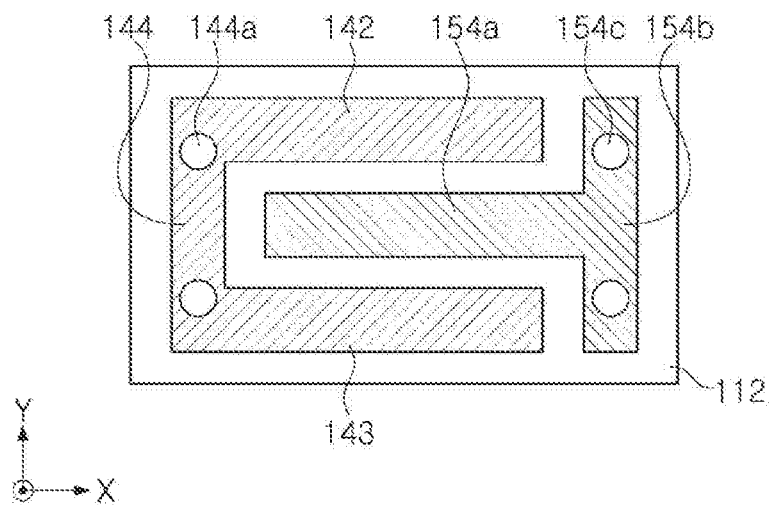

FIGS. 6A and 6B are plan diagrams illustrating another example embodiment of first and second internal electrodes of a multilayer capacitor.

Referring to FIGS. 6A and 6B, the first internal electrode may include a 1-1st internal electrode 141a disposed on a first dielectric layer 111 and two 1-2nd internal electrodes 142 and 143 disposed on a second dielectric layer 112 and configured to not overlap the 1-1st internal electrode 141a in the Z direction (when the first and second dielectric layers 111 and 112 are stacked in the capacitor body 110).

A 1-1st connection portion 141b may be connected to an end of the 1-1st internal electrode 141a and may be connected to a first via electrode 133.

A 1-2nd connection portion 144 may be connected to ends of the two 1-2nd internal electrodes 142 and 143, may overlap the 1-1st connection portion 141b in the Z direction, and may be connected to the first via electrode 133.

A first via through hole may be formed in the first dielectric layer 111, the second dielectric layer 112, the 1-1st connection portion 141b, and the 1-2nd connection portion 144 such that the first via electrode 133 may penetrate through the first dielectric layer 111, the second dielectric layer 112, the 1-1st connection portion 141b, and the 1-2nd connection portion 144 in the Z direction.

The second internal electrode may include two 2-1st internal electrodes 151 and 152 disposed on the first dielectric layer 111 and configured to overlap the two 1-2nd internal electrodes 142 and 143 in the Z direction, respectively, and a 2-2nd internal electrode 154a disposed on the second dielectric layer 112 and configured to overlap the 1-1st internal electrode 141a in the Z direction.

Also, a 2-1st connection portion 153 may be connected to ends of the two 2-1st internal electrodes 151 and 152, and may be connected to the second via electrode 134.

A 2-2nd connection portion 154b may be connected to the 2-2nd internal electrode 154a, may be disposed in a position in which the 2-2nd connection portion 154b overlaps the 2-1st connection portion 153 in the Z direction, and may be connected to the second via electrode 134.

Second via through holes 153a and 154c may be formed in the first dielectric layer 111, the second dielectric layer 112, the 2-1st connection portion 153, and the 2-2nd connection portion 154b such that the second via electrode 134 may penetrate through the first dielectric layer 111, the second dielectric layer 112, the 2-1st connection portion 153, and the 2-2nd connection portion 154b in the Z direction.

Each of a combination structure of the 1-1st internal electrode 141a and the 1-1st connection portion 141b and a combination structure of the 2-2nd internal electrode 154a and the 2-2nd connection portion 154b may have a "⊥"-shaped form.

Each of a combination structure of the two 1-2nd internal electrodes 142 and 143 and the 1-2nd connection portion 144 and a combination structure of the two 2-1st internal electrodes 151 and 152 and the 2-1st connection portion 153 may have a "⊏"-shaped form.

In another example embodiment, the first internal electrode may include a plurality of 1-1st internal electrodes disposed on the first dielectric layer and spaced apart from each other in the second direction; a plurality of 1-2nd internal electrodes disposed on the second dielectric layer and configured to not overlap the plurality of 1-1st internal electrodes in the first direction and to be spaced apart from each other in the second direction (when the first and second dielectric layers 111 and 112 are stacked in the capacitor body 110); a 1-1st connection portion connected to the plurality of 1-1st internal electrodes and connected to the first via electrode; and a 1-2nd connection portion connected to the plurality of 1-2nd internal electrodes and configured to overlap the 1-1st connection portion in the first direction and to be connected to the first via electrode.

The second internal electrode may include a plurality of 2-1st internal electrodes disposed on the first dielectric layer and configured to overlap the plurality of 1-2nd internal electrodes in the first direction, respectively, and to be spaced apart from each other in the second direction; a plurality of 2-2nd internal electrodes disposed on the second dielectric layer and configured to overlap the plurality of 1-1st internal electrodes in the first direction, respectively, and to be spaced apart from each other in the second direction; a 2-1st connection portion connected to the plurality of 2-1st internal electrodes and connected to the second via electrode; and a 2-2 connection portion connected to the plurality of 2-2nd internal electrodes and configured to overlap the 2-1st connection portion in the first direction and to be connected to the second via electrode.

According to the example embodiment, as the amount of current passing through the multilayer capacitor increases, directions of electrical fields may be offset from each other such that an inductance element may be reduced, and ESL and ESR of the multilayer capacitor may be reduced.

In the description below, an example embodiment will be described in greater detail.

Figure 7A:
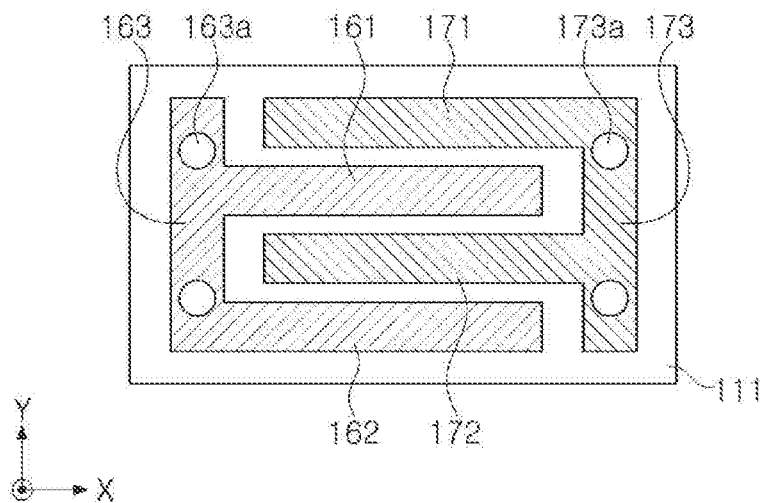
FIGS. 7A and 7B are plan diagrams illustrating another example embodiment of first and second internal electrodes of a multilayer capacitor.
Figure 7B:
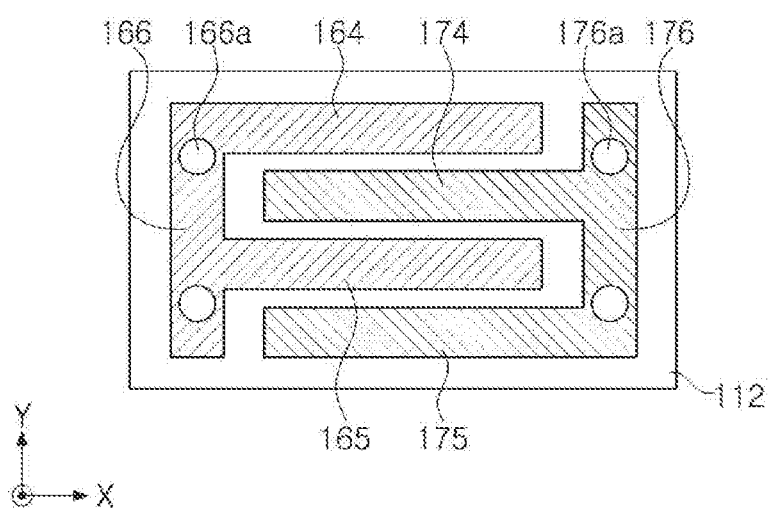

FIGS. 7A and 7B are plan diagrams illustrating another example embodiment of first and second internal electrodes of a multilayer capacitor.

Referring to FIGS. 7A and 7B, a first internal electrode may include two 1-1st internal electrodes 161 and 162 disposed on a first dielectric layer 111 and spaced apart from each other in the Y direction, and two 1-2nd internal electrodes 164 and 165 disposed on a second dielectric layer 112 and configured to not overlap the two 1-1st internal electrodes 161 and 162 in the Z direction (when the first and second dielectric layers 111 and 112 are stacked in the capacitor body 110) and to be spaced apart from each other in the Y direction.

A 1-1st connection portion 163 may be connected to ends of the two 1-1st internal electrodes 161 and 162 and may be connected to the first via electrode 133.

A 1-2nd connection portion 166 may be connected to ends of the two 1-2nd internal electrodes 164 and 165 and may overlap the 1-1st connection portion 163 in the Z direction and may be connected to the first via electrode 133.

First via through holes 163a and 166a may be formed in the first dielectric layer 111, the second dielectric layer 112, the 1-1st connection portion 163, and the 1-2nd connection portion 166 such that the first via electrode 133 may penetrate through the first dielectric layer 111, the second dielectric layer 112, the 1-1st connection portion 163, and the 1-2nd connection portion 166 in the Z direction.

The second internal electrode may include two 2-1st internal electrodes 171 and 172 disposed on the first dielectric layer 111 and configured to overlap the two 1-2nd internal electrodes 164 and 165 in the Z direction, respectively, and to be spaced apart from each other in the Y direction, and two 2-2nd internal electrodes 174 and 175 disposed on the second dielectric layer 112 and configured to overlap the two 1-1st internal electrodes 161 and 162 in the Z direction, respectively, and to be spaced apart from each other in the Y direction.

A 2-1st connection portion 173 may be connected to ends of the two 2-1st internal electrodes 171 and 172 and may be connected to the second via electrode 134.

A 2-2nd connection portion 176 may be connected to ends of the two 2-2nd internal electrodes 174 and 175, and may overlap the 2-1st connection portion 173 in the Z direction and may be connected to the second via electrode 134.

Second via through holes 173a and 176a may be formed in the first dielectric layer 111, the second dielectric layer 112, the 2-1st connection portion 173, and the 2-2nd connection portion 176 such that the second via electrode 134 may penetrate through the first dielectric layer 111, the second dielectric layer 112, the 2-1st connection portion 173, and the 2-2nd connection portion 176 in the Z direction.

Figure 8A:
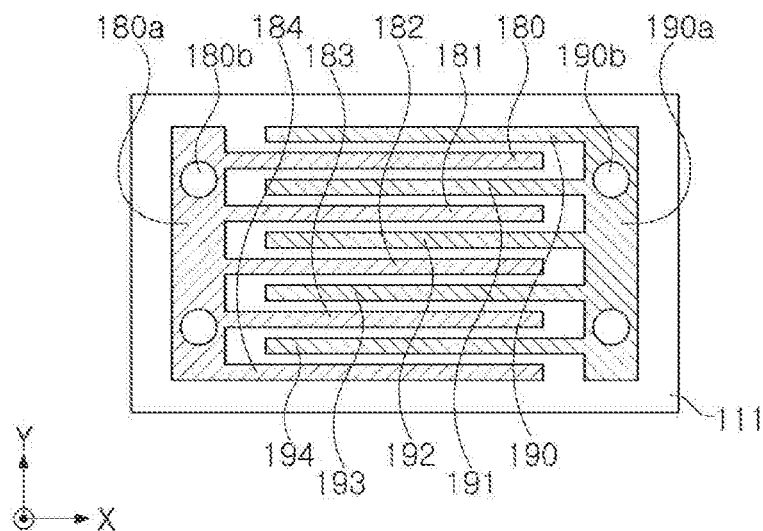
FIGS. 8A and 8B are plan diagrams illustrating another example embodiment of first and second internal electrodes of a multilayer capacitor.
Figure 8B:
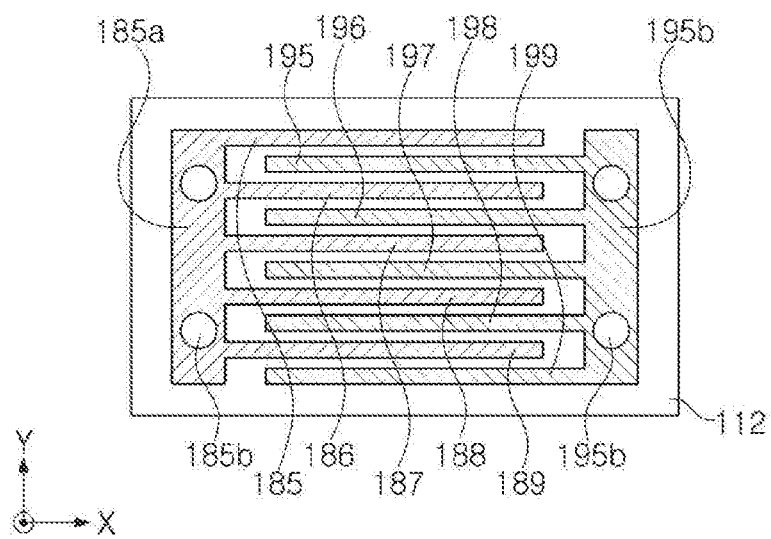

FIGS. 8A and 8B are plan diagrams illustrating another example embodiment of first and second internal electrodes of a multilayer capacitor.

Referring to FIGS. 8A and 8B, a first internal electrode may include five 1-1st internal electrodes 180 to 184 disposed on a first dielectric layer 111 and spaced apart from each other in the Y direction, and five 1-2nd internal electrodes 185 to 189 disposed on a second dielectric layer 112 and configured to not overlap the five 1-1st internal electrodes 180 to 184 in the Z direction (when the first and second dielectric layers 111 and 112 are stacked in the capacitor body 110) and to be spaced apart from each other in the Y direction.

A 1-1st connection portion 180a may be connected to ends of the five 1-1st internal electrodes 180 to 184, and may be connected to a first via electrode 133.

A 1-2nd connection portion 185a may be connected to ends of the five 1-2nd internal electrodes 185 to 189, and may overlap the 1-1st connection portion 180a in the Z direction and may be connected to the first via electrode 133.

First via through holes 180b and 185b may be formed in the first dielectric layer 111, the second dielectric layer 112, the 1-1st connection portion 180a, and the 1-2nd connection portion 185a such that the first via electrode 133 may penetrate through the first dielectric layer 111, the second dielectric layer 112, the 1-1st connection portion 180a, and the 1-2nd connection portion 185a in the Z direction and may connect the first internal electrode to a first external electrode 131.

The second internal electrode may include five 2-1st internal electrodes 190 to 194 disposed on the first dielectric layer 111, and configured to overlap the five 1-2nd internal electrodes 185 to 189 in the Z direction, respectively, and to be spaced apart from each other in the Y direction, and five 2-2nd internal electrodes 195 to 199 disposed on the second dielectric layer 112 and configured to overlap the five 1-1st internal electrodes 180 to 184 in the Z direction, respectively, and to be spaced apart from each other in the Y direction.

A 2-1st connection portion 190a may be connected to ends of the five 2-1st internal electrodes 190 to 194, and may be connected to the second via electrode 134.

A 2-2nd connection portion 195a may be connected to ends of the five 2-2nd internal electrodes 195 to 199, and may overlap the 2-1st connection portion 190a in the Z direction and may be connected to the second via electrode 134.

Second via through holes 190b and 195b may be formed in the first dielectric layer 111, the second dielectric layer 112, the 2-1st connection portion 190a, and the 2-2nd connection portion 195a such that the second via electrode 134 may penetrate through the first dielectric layer 111, the second dielectric layer 112, the 2-1st connection portion 190a, and the 2-2nd connection portion 195a and may connect the second internal electrode to a second external electrode 132.

The multilayer capacitor as configured above may increase a volume of a product as a lower surface electrode structure, and the first and second internal electrodes may overlap in the Z direction and also in the Y direction such that an effective area of the internal electrodes which relates to forming capacitance of the multilayer capacitor may increase. Accordingly, capacitance of the multilayer capacitor may increase.

According to the example embodiment, an effective area of the internal electrodes may increase by 68% approximately as compared to a general multilayer capacitor.

Also, in a conductor in which a current flows, an electrical field may be formed in accordance with a path of a current, and accordingly, an inductance element may be inevitably generated in a direction in which a flow of current is prevented. In a general multilayer capacitor, first and second internal electrodes may be disposed upwardly and downwardly such that a single current path may be implemented.

In the example embodiment, the number of current paths of a multilayer capacitor may greatly increase and directions of currents may be disposed in opposite directions. Accordingly, directions of electrical charges may be offset from each other such that an inductance element may be reduced, and accordingly, ESL and ESR of the multilayer capacitor may be reduced.

Accordingly, the multilayer capacitor of the example embodiment may be applied to various applications requiring relatively low ESL, such as an access point (AP), a smartphone, a laptop, a tablet, a vehicle component, and the like.

If desired, differently from the example embodiment illustrated in the diagrams, in the multilayer capacitor of the example embodiment, the first and second external electrodes may be disposed on the first surface of the capacitor body and may be spaced apart from each other in the Y direction, and the first and second internal electrodes may be configured to rotate in a clockwise direction by 90°.

Figure 9:
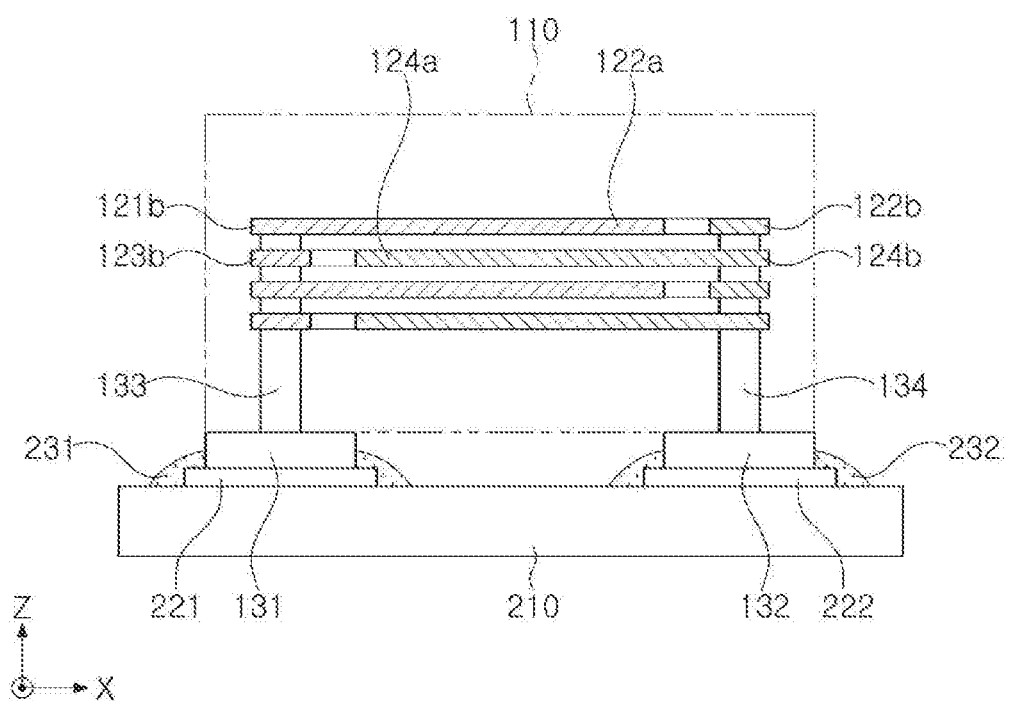
FIG. 9 is a cross-sectional diagram illustrating a state in which a multilayer capacitor is mounted on a board.

Referring to FIG. 9, a board on which a multilayer capacitor is mounted may include a board 210 having first and second electrode pads 221 and 222, and a multilayer capacitor 100 mounted on an upper surface of the board 210, where first and second external electrodes 131 and 132 may be connected to the first and second electrode pads 221 and 222, respectively. The view of the multilayer capacitor 100 shown in FIG. 9 may correspond to a cross-sectional view along II-II' shown in FIG. 1.

In the example embodiment, the multilayer capacitor 100 may be configured to be mounted on the board 210 by solders 231 and 232, but an example embodiment thereof is not limited thereto. Instead of solder, conductive paste may be used.

According to the aforementioned example embodiment, by disposing an external electrode on a lower surface of the capacitor body, a volume of a product may increase and an effective area of an internal electrode may be controlled such that the multilayer capacitor may have high capacitance and may have reduced ESR and ESL.

While the exemplary embodiments have been shown and described above, it will be apparent to those skilled in the art that modifications and variations could be made without departing from the scope of the present invention as defined by the appended claims.

What is claimed is:

1. A multilayer capacitor, comprising:
a capacitor body including first and second surfaces opposing each other, third and fourth surfaces connected to the first and second surfaces and opposing each other, fifth and sixth surfaces connected to the first and second surfaces and to the third and fourth surfaces and opposing each other, and including first and second dielectric layers and pluralities of first and second internal electrodes alternately layered in a first direction in which the first and second surfaces are connected to each other;
first and second external electrodes disposed on the first surface of the capacitor body and spaced apart from each other;
a first via electrode connecting the plurality of first internal electrodes to the first external electrode in the capacitor body; and
a second via electrode connecting the plurality of second internal electrodes to the second external electrode in the capacitor body,
wherein first and second internal electrodes are spaced apart from each other on the first dielectric layer, and first and second internal electrodes are spaced apart from each other on the second dielectric layer,
wherein the first and second dielectric layers are alternately stacked in the first direction such that the first internal electrode of the first dielectric layer overlaps the second internal electrode of the second dielectric layer in the first direction, and the second internal electrode of the first dielectric layer overlaps the first internal electrode of the second dielectric layer in the first direction, and
wherein the first and second internal electrodes each have first and second portions which extend in directions that intersect each other and that are perpendicular to the first direction, the first portions overlapping each other in the first direction and the first and second via electrodes arranged in the second portions.

2. The multilayer capacitor of claim 1, wherein the first and second internal electrodes on the second dielectric layer are symmetrical to the first and second internal electrodes disposed on the first dielectric layer about a plane orthogonal to a second direction in which the fifth and sixth surfaces are connected to each other.

3. The multilayer capacitor of claim 1,
wherein the plurality of first internal electrodes includes:
a 1-1st internal electrode disposed on the first dielectric layer;
a 1-2nd internal electrode disposed on the second dielectric layer to not overlap the 1-1st internal electrode in the first direction;
a 1-1st connection portion connected to the 1-1st internal electrode and connected to the first via electrode; and
a 1-2nd connection portion connected to the 1-2nd internal electrode, disposed to overlap the 1-1st connection portion in the first direction, and connected to the first via electrode, and
wherein the plurality of second internal electrodes includes:
a 2-1st internal electrode disposed on the first dielectric layer to overlap the 1-2nd internal electrode in the first direction;
a 2-2nd internal electrode disposed on the second dielectric layer to overlap the 1-1st internal electrode in the first direction;
a 2-1st connection portion connected to the 2-1st internal electrode and connected to the second via electrode; and
a 2-2nd connection portion connected to the 2-2nd internal electrode, disposed to overlap the 2-1st connection portion in the first direction, and connected to the second via electrode.

4. The multilayer capacitor of claim 3,
wherein a first via through hole is disposed in the first dielectric layer, the second dielectric layer, the 1-1st connection portion, and the 1-2nd connection portion such that the first via electrode penetrates through the first dielectric layer, the second dielectric layer, the 1-1st connection portion, and the 1-2nd connection portion in the first direction, and
wherein a second via through hole is disposed in the first dielectric layer, the second dielectric layer, the 2-1st connection portion, and the 2-2nd connection portion such that the second via electrode penetrates through the first dielectric layer, the second dielectric layer, the 2-1st connection portion, and the 2-2nd connection portion in the first direction.

5. The multilayer capacitor of claim 3, wherein each of the first and second internal electrodes has an L-shaped form.

6. The multilayer capacitor of claim 1,
wherein the plurality of first internal electrodes includes:
a 1-1st internal electrode disposed on the first dielectric layer;
a plurality of 1-2nd internal electrodes disposed on the second dielectric layer to not overlap the 1-1st internal electrode in the first direction;
a 1-1st connection portion connected to the 1-1st internal electrode and connected to the first via electrode; and
a 1-2nd connection portion connected to the plurality of 1-2nd internal electrodes, disposed to overlap the 1-1st connection portion in the first direction, and connected to the first via electrode,
wherein the plurality of second internal electrodes includes:
a plurality of 2-1st internal electrodes disposed on the first dielectric layer to overlap the plurality of 1-2nd internal electrodes in the first direction;
a 2-2nd internal electrode disposed on the second dielectric layer to overlap the 1-1st internal electrode in the first direction;

a 2-1st connection portion connected to the plurality of 2-1st internal electrodes and connected to the second via electrode; and a 2-2nd connection portion connected to the 2-2nd internal electrode, disposed to overlap the 2-1st connection portion in the first direction, and connected to the second via electrode.

7. The multilayer capacitor of claim 6, wherein a first via through hole is disposed in the first dielectric layer, the second dielectric layer, the 1-1st connection portion, and the 1-2nd connection portion such that the first via electrode penetrates through the first dielectric layer, the second dielectric layer, the 1-1st connection portion, and the 1-2nd connection portion in the first direction, and wherein a second via through hole is disposed in the first dielectric layer, the second dielectric layer, the 2-1st connection portion, and the 2-2nd connection portion such that the second via electrode penetrates through the first dielectric layer, the second dielectric layer, the 2-1st connection portion, and the 2-2nd connection portion in the first direction.

8. The multilayer capacitor of claim 6, wherein each of a combination structure of the 1-1st internal electrode and the 1-1st connection portion and a combination structure of the 2-2nd internal electrode and the 2-2nd connection portion has a "⊥"-shaped form, and wherein each of a combination structure of the 1-2nd internal electrodes and the 1-2nd connection portion and a combination structure of the 2-1st internal electrodes and the 2-1st connection portion has a "⊏"-shaped form.

9. The multilayer capacitor of claim 1, wherein the plurality of first internal electrodes includes:

a plurality of 1-1st internal electrodes disposed on the first dielectric layer and spaced apart from each other in a second direction perpendicular to the first direction;

a plurality of 1-2nd internal electrodes disposed on the second dielectric layer to not overlap the plurality of 1-1st internal electrodes in the first direction and to be spaced apart from each other in the second direction;

a 1-1st connection portion connected to the plurality of 1-1st internal electrodes and connected to the first via electrode; and a 1-2nd connection portion connected to the plurality of 1-2nd internal electrodes and disposed to overlap the 1-1st connection portion in the first direction and to be connected to the first via electrode, and wherein the plurality of second internal electrodes includes:

a plurality of 2-1st internal electrodes disposed on the first dielectric layer to overlap the plurality of 1-2nd internal electrodes in the first direction, and to be spaced apart from each other in the second direction;

a plurality of 2-2nd internal electrode disposed on the second dielectric layer to overlap the plurality of 1-1st internal electrodes in the first direction, and to be spaced apart from each other in the second direction;

a 2-1st connection portion connected to the plurality of 2-1st internal electrodes and connected to the second via electrode; and a 2-2nd connection portion connected to the plurality of 2-2nd internal electrodes, disposed to overlap the 2-1st connection portion in the first direction, and connected to the second via electrode.

10. The multilayer capacitor of claim 9, wherein a first via through hole is disposed in the first dielectric layer, the second dielectric layer, the 1-1st connection portion, and the 1-2nd connection portion such that the first via electrode penetrates through the first dielectric layer, the second dielectric layer, the 1-1st connection portion, and the 1-2nd connection in the first direction, and wherein a second via through hole is disposed in the first dielectric layer, the second dielectric layer, the 2-1st connection portion, and the 2-2nd connection portion such that the second via electrode penetrates through the first dielectric layer, the second dielectric layer, the 2-1st connection portion, and the 2-2nd connection portion in the first direction.

11. A board on which a multilayer capacitor is mounted, the board comprising:

a board having first and second electrode pads on one surface; and a multilayer capacitor including a capacitor body including first and second surfaces opposing each other, third and fourth surfaces connected to the first and second surfaces and opposing each other, fifth and sixth surfaces connected to the first and second surfaces and to the third and fourth surfaces and opposing each other, and including first and second dielectric layers and pluralities of first and second internal electrodes alternately layered in a first direction in which the first and second surfaces are connected to each other; first and second external electrodes disposed on the first surface of the capacitor body and spaced apart from each other; a first via electrode connecting the plurality of first internal electrodes to the first external electrode in the capacitor body; and a second via electrode connecting the plurality of second internal electrodes to the second external electrode in the capacitor body, where first and second internal electrodes are disposed on the first dielectric layer and are spaced apart from each other, and first and second internal electrodes are disposed on the second dielectric layer and are spaced apart from each other, and where the first and second dielectric layers are alternately layered in the first direction such that the first internal electrode of the first dielectric layer overlaps the second internal electrode of the second dielectric layer in the first direction, and the second internal electrode of the first dielectric layer overlaps the first internal electrode of the second dielectric layer in the first direction, wherein the first and second external electrodes are mounted on and connected to the first and second electrode pads, respectively, and wherein the first and second internal electrodes each have first and second portions which extend in directions that intersect each other and that are perpendicular to the first direction, the first portions overlapping each other in the first direction and the first and second via electrodes arranged in the second portions.

12. A multilayer capacitor comprising:

a capacitor body including a plurality of dielectric layers stacked with each other in a stacking direction and each having a first internal electrode and a second internal electrode disposed thereon; and first and second external electrodes disposed on at least one external surface of the body, wherein the first external electrode is connected, by a first via electrode, to the first internal electrode disposed on each of the plurality of dielectric layers, and the second external electrode is connected, by a second via electrode, to the second internal electrode disposed on each of the plurality of dielectric layers, and wherein the first and second internal electrodes each have first and second portions which extend in directions that intersect each other and that are perpendicular to the stacking direction, the first portions overlapping each other in the first direction and the first and second via electrodes arranged in the second portions.

13. The multilayer capacitor of claim 12, wherein each first internal electrode is disposed on a respective dielectric layer outside of an area of overlap along the stacking direction of the dielectric layers relative to first internal electrodes disposed on dielectric layers directly adjacent to the respective dielectric layer.

14. The multilayer capacitor of claim 13, wherein the first internal electrodes disposed on every other dielectric layer among the plurality of stacked dielectric layers overlap with each other along the stacking direction of the dielectric layers.

15. The multilayer capacitor of claim 13, wherein each dielectric layer further includes a first connection portion connected to the first internal electrode and overlapping in the stacking direction with the first connection portions of other dielectric layers, and a second connection portion connected to the second internal electrode and overlapping in the stacking direction with the second connection portions of other dielectric layers.

16. The multilayer capacitor of claim 15, wherein the first and second via electrodes extend through the plurality of dielectric layers, and respectively connect the first external electrode and first connection portions of the plurality of dielectric layers and connect the second external electrode and second connection portions of the plurality of dielectric layers.

17. The multilayer capacitor of claim 12, wherein each first internal electrode disposed on a respective dielectric layer overlaps along the stacking direction of the dielectric layers with a second internal electrode disposed on a dielectric layer directly adjacent to the respective dielectric layer.

18. A multilayer capacitor comprising:
a capacitor body including a plurality of dielectric layers stacked with each other in a stacking direction and each having a first internal electrode, a first connection portion, a second internal electrode, and a second connection portion disposed thereon; and
first and second external electrodes disposed on at least one external surface of the body and connected, by a respective first and second via electrode, to the first and second internal electrodes, respectively,
wherein each of the first internal electrode, the first connection portion, the second internal electrode, and the second connection portion has a rectangular shape having a length greater than a width,
the first internal electrode and the first connection portion are connected to each other and have lengths orthogonal to each other, and the second internal electrode and the second connection portion are connected to each other and have lengths orthogonal to each other, the first connection portion on each of the plurality of dielectric layers overlap with each other in the stacking direction, and the second connection portion on each of the plurality of dielectric layers overlap with each other in the stacking direction, and the first and second via electrodes are arranged in the first and second connection portions, respectively.

19. The multilayer capacitor of claim 18, wherein each first internal electrode is disposed on a respective dielectric layer outside of an area of overlap along the stacking direction relative to first internal electrodes disposed on dielectric layers directly adjacent to the respective dielectric layer.

20. The multilayer capacitor of claim 18, wherein the first internal electrodes disposed on every alternate dielectric layer among the plurality of stacked dielectric layers overlap with each other along the stacking direction.

21. The multilayer capacitor of claim 18, wherein the first internal electrode and the first connection portion are disposed in an L-shape on each dielectric layer, and the second internal electrode and the second connection portion are disposed in an L-shape on each dielectric layer.

22. The multilayer capacitor of claim 18, wherein each dielectric layer includes at least one first internal electrode and at least one second internal electrode, and
the at least one first internal electrode and the first connection portion are disposed in a T-shape on each alternate dielectric layer in the stacking direction, and disposed in a U-shape on each other alternate dielectric layer in the stacking direction.

23. The multilayer capacitor of claim 18, wherein each dielectric layer includes:
two or more first internal electrodes each connected to the first connection portion of the dielectric layer and each having a rectangular shape with a length greater than a width and orthogonal to a length of the first connection portion, and
two or more second internal electrodes each connected to the second connection portion of the dielectric layer and each having a rectangular shape with a length greater than a width and orthogonal to a length of the second connection portion.

24. The multilayer capacitor of claim 23, wherein each first internal electrode is disposed on a respective dielectric layer outside of an area of overlap along the stacking direction relative to first internal electrodes disposed on dielectric layers directly adjacent to the respective dielectric layer.

25. The multilayer capacitor of claim 24, wherein the first internal electrodes disposed on every other dielectric layer among the plurality of stacked dielectric layers overlap with each other along the stacking direction of the dielectric layers.

* * * * *